US011146212B1

(12) United States Patent
Anderegg

(10) Patent No.: US 11,146,212 B1
(45) Date of Patent: Oct. 12, 2021

(54) SOLAR PANEL PERFORMANCE MODELING AND MONITORING

(71) Applicant: Alarm.com Incorporated, Tysons, VA (US)

(72) Inventor: Caspar John Anderegg, Minneapolis, MN (US)

(73) Assignee: Alarm.com Incorporated, Tysons, VA (US)

( * ) Notice: Subject to any disclaimer, the term of this patent is extended or adjusted under 35 U.S.C. 154(b) by 139 days.

(21) Appl. No.: 16/750,548

(22) Filed: Jan. 23, 2020

Related U.S. Application Data

(60) Provisional application No. 62/796,294, filed on Jan. 24, 2019.

(51) Int. Cl.
| | |
|---|---|
| *H02S 50/00* | (2014.01) |
| *G01R 31/00* | (2006.01) |
| *F24S 50/20* | (2018.01) |
| *G01S 3/786* | (2006.01) |

(52) U.S. Cl.
CPC ............. *H02S 50/00* (2013.01); *F24S 50/20* (2018.05); *G01R 31/00* (2013.01); *G01S 3/7861* (2013.01); *F24S 2201/00* (2018.05)

(58) Field of Classification Search
CPC ....... H02S 50/00; F24S 50/20; F24S 2201/00; G01S 3/7861
See application file for complete search history.

(56) References Cited

U.S. PATENT DOCUMENTS

| | | | |
|---|---|---|---|
| 8,725,437 B2 | 5/2014 | Caine | |
| 9,433,336 B2 | 9/2016 | Mazumder | |
| 10,031,503 B2 * | 7/2018 | Matsumoto | ............... H02J 3/14 |
| 10,232,505 B2 | 3/2019 | Tadayon | |
| 10,892,618 B1 * | 1/2021 | Cooper | ..................... H02J 3/14 |

OTHER PUBLICATIONS

King et al., "Photovoltaic Array Performance Model," SAND2004-3535, Sandia National Laboratories, Dec. 2004, 43 pages.
Tian et al., "A Detailed Performance Model for Photovoltaic Systems—Preprint," NREL/JA-5500-54601, NREL, Contract No. DE-AC36-08GO28308, Jul. 2012, 56 pages.

* cited by examiner

*Primary Examiner* — Seung C Sohn
(74) *Attorney, Agent, or Firm* — Fish & Richardson P.C.

(57) ABSTRACT

A monitoring system that is configured to monitor a property is disclosed. The monitoring system includes a sensor that is configured to generate sensor data that reflects an attribute of the property; a solar panel that is configured to generate and output power; and a monitor control unit. The monitor control unit is configured to: monitor the power outputted by the solar panel; determine that the power outputted by the solar panel has deviated from an expected power range; based on determining that the power outputted by the solar panel has deviated from the expected power range, access the sensor data; based on the power outputted by the solar panel and the sensor data, determine a likely cause of the deviation from the expected power range; and determine an action to perform to remediate the likely cause of the deviation from the expected power range.

20 Claims, 6 Drawing Sheets

| Scenario | Cause | Additional Information | Automatic Systems Available | System Action |
|---|---|---|---|---|
| S1 | Snow | Forecast > 32°F | Heating coils | None - Snow expected to melt on its own |
| S2 | Snow | Forecast < 32°F | Heating coils | Activate snow melt heating coils |
| S3 | Snow | Forecast < 32°F | Heat radiating drone | Activate heat radiating drone |
| S4 | Snow | Forecast < 32°F | None | Recommend manual removal with rake |
| P1 | Pollen | Forecast = rain | Water spraying nozzles | None - Rain expected to remove pollen |
| P2 | Pollen | Forecast = clear | Water spraying nozzles | Activate water spraying nozzles |
| P3 | Pollen | Forecast = clear | Water spraying drone | Activate water spraying drone |
| P4 | Pollen | Forecast = clear | None | Recommend manual removal of pollen with hose |
| N1 | Non-optimal Angle | Optimal angle calculated | Automatic tilt system | Activate automatic tilt |
| N2 | Non-optimal Angle | Optimal angle calculated | None | Recommend manual tilt |
| E1 | End-of-Life | 20 years since installation | None | Recommend replacement |
| D1 | Damage | Weather = hailstorm | Camera drone | Activate camera drone to inspect; recommend repair or replace |
| D2 | Damage | Weather = hailstorm | None | Recommend visual inspection |

FIG. 5

SOLAR PANEL PERFORMANCE MODELING AND MONITORING

CROSS-REFERENCE TO RELATED APPLICATION

This application claims the benefit of U.S. Application No. 62/796,294, filed Jan. 24, 2019, which is incorporated by reference.

TECHNICAL FIELD

This specification generally relates to monitoring systems.

BACKGROUND

Many properties are equipped with solar panels that generate power using energy from the sun.

SUMMARY

Many residents, homeowners, and businesses equip their properties with solar panel systems to generate electric power using energy from the sun. The solar panels can provide electric power to the property, or can provide electric power to the electrical grid.

Solar panel power output is affected by many factors. Using solar panel output data, in combination with other data sources such as weather data, temperature data, light sensor data, etc., the underlying solar panel efficiency can be modeled. The degradation of solar panel performance can thus be measured and tracked over time. The information can be used by residents to make decisions about when to repair or replace a solar panel. The information can also be used to identify anomalies in solar panel power output, and to take action to correct any performance deficiencies.

Solar panel monitoring and modeling can be performed by property monitoring systems. In some implementations, monitoring systems can dynamically control and configure devices and components of the property based on solar panel power output data. For instance, if the monitoring system detects debris on solar panels, it can activate automatic cleaning systems. The monitoring system can also perform actions to alert the resident to damaged or degraded solar panels by sending a notification to the resident's mobile device.

Certain implementations of the disclosed systems, techniques, and methods have particular advantages. In some cases, the monitoring system can determine when a solar panel has reached the end of its useful life and needs to be replaced. The monitoring system can notify the resident of the degraded performance of the solar panel, and recommend replacement.

According to an innovative aspect of the subject matter described in this application, a monitoring system is configured to monitor a property. The monitoring system includes a sensor that is configured to generate sensor data that reflects an attribute of the property; a solar panel that is configured to generate and output power; and a monitor control unit that is configured to: monitor the power outputted by the solar panel; determine that the power outputted by the solar panel has deviated from an expected power range; based on determining that the power outputted by the solar panel has deviated from the expected power range, access the sensor data; based on the power outputted by the solar panel and the sensor data, determine a likely cause of the deviation from the expected power range; and determine an action to perform to remediate the likely cause of the deviation from the expected power range.

These and other implementations can each optionally include one or more of the following features, alone or in combination. The monitoring system may include an automatic snow melt system including a heating element that is configured to transfer heat to the solar panel. The monitor control unit may be configured to receive automatic snow melt system data indicating an availability of the automatic snow melt system; determine the likely cause of the deviation from the expected power range by determining that snow has likely accumulated on the solar panel; determine the action to perform to remediate the likely cause of the deviation from the expected power range by determining to activate the automatic snow melt system to melt the snow; and provide, for output to the automatic snow melt system, an instruction to activate the heating element.

In some implementations, after providing, for output to the automatic snow melt system, the instruction to activate the heating element, the monitor control unit is configured to: determine that the power outputted by the solar panel has returned to the expected power range; and based on determining that the power outputted by the solar panel has returned to the expected power range, provide, for output to the automatic snow melt system, an instruction to deactivate the heating element.

In some implementations, the sensor is a camera that is configured to generate image data; and the monitor control unit is configured to: determine that snow is present at the property by analyzing the image data; and determine that snow has likely accumulated on the solar panel based on determining that snow is present at the property.

In some implementations, the monitoring system includes an automatic snow melt system including a heating element that is configured to transfer heat to the solar panel; and a thermometer that is configured to generate temperature data that reflects an outdoor temperature at the property. The sensor may be a camera that is configured to generate image data. The monitor control unit may be configured to: determine that snow is present at the property by analyzing the image data; determine the likely cause of the deviation from the expected power range by determining that snow has likely accumulated on the solar panel based on determining that snow is present at the property; based on the temperature data, determine that the snow is likely to melt within a threshold period of time; and determine the action to perform to remediate the likely cause of the deviation from the expected power range by determining to bypass activating the heating element.

In some implementations, the monitoring system includes an automatic cleaning system that is configured to remove debris from the solar panel. The monitor control unit may be configured to: receive automatic cleaning system data indicating an availability of the automatic cleaning system; determine the likely cause of the deviation from the expected power range by determining that debris has likely accumulated on the solar panel; determine the action to perform to remediate the likely cause of the deviation from the expected power range by determining to activate the automatic cleaning system; and provide, for output to the automatic cleaning system, an instruction to activate the automatic cleaning system.

In some implementations, after providing, for output to the automatic cleaning system, the instruction to activate the automatic cleaning system, the monitor control unit is configured to: determine that the power outputted by the solar panel has returned to the expected power range; and based on determining that the power outputted by the solar panel has returned to the expected power range, provide, for output to the automatic cleaning system, an instruction to deactivate the automatic cleaning system.

In some implementations, the monitor control unit is configured to: receive weather data indicating atmospheric conditions at the property; and determine that debris has likely accumulated on the solar panel based on the weather data.

In some implementations, the monitoring system includes an automatic tilt system that is configured to adjust a tilt angle of the solar panel. The monitor control unit may be configured to: receive automatic tilt system data indicating an availability of the automatic tilt system; determine the likely cause of the deviation from the expected power range by determining that the solar panel is not tilted toward a sun; determine the action to perform to remediate the likely cause of the deviation from the expected power range by determining to adjust the tilt angle of the solar panel; and provide, for output to the automatic tilt system, an instruction to adjust the tilt angle of the solar panel.

In some implementations, after providing, for output to the automatic tilt system, the instruction to adjust the tilt angle of the solar panel, the monitor control unit is configured to: determine that the power outputted by the solar panel has returned to the expected power range; and based on determining that the power outputted by the solar panel has returned to the expected power range, provide, for output to the automatic tilt system, an instruction to cease adjusting the tilt angle of the solar panel.

In some implementations, the monitoring system includes: an aerial drone including a camera. The monitor control unit may be configured to: receive aerial drone data indicating an availability of the aerial drone; based on determining that the power outputted by the solar panel has deviated from the expected power range, provide, for output to the aerial drone, an instruction to capture an image of the solar panel; receive, from the aerial drone, the image of the solar panel; and determine the likely cause of the deviation from the expected power range based further on the image of the solar panel.

In some implementations, the monitor control unit is configured to calculate the expected power range based on one or more of: a geographic location of the solar panel; a time of day; a time of year; a weather condition at the geographic location of the solar panel; and an age of the solar panel.

In some implementations, the monitor control unit is configured to: calculate, based on a power outputted by the solar panel at a first time, and a power outputted by the solar panel at a second time, a rate of change of power outputted by the solar panel between the first time and the second time; determine that the rate of change of power outputted by the solar panel is greater than a threshold rate of change; determine a likely cause of the rate of change of power outputted by the solar panel being greater than the threshold rate of change; and determine an action to perform to remediate the likely cause of the rate of change of power outputted by the solar panel being greater than the threshold rate of change.

In some implementations, the action includes transmitting a notification to a resident of the property indicating that the power outputted by the solar panel has deviated from the expected power range.

In some implementations, the action includes transmitting a notification to a resident of the property recommending replacement of the solar panel.

Other implementations of this aspect include corresponding systems, apparatus, and computer programs recorded on computer storage devices, each configured to perform the operations of the methods.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIG. 5 is a table summarizing various possible causes of decreased solar panel power output, and potential responses of the monitoring system.

Like reference numbers and designations in the various drawings indicate like elements.

DETAILED DESCRIPTION

Figure 1:
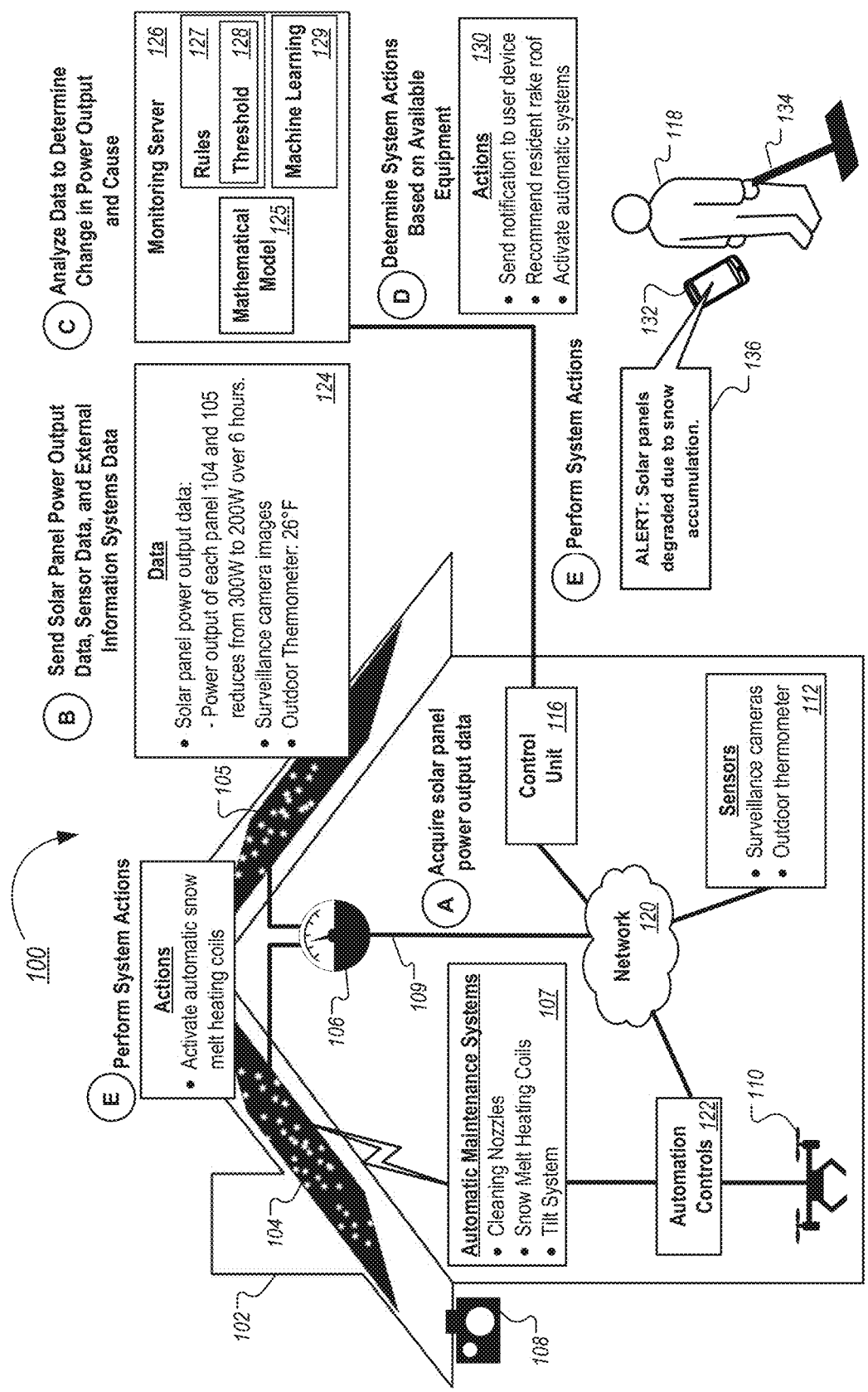
FIG. 1 is a diagram illustrating an example of a system for property control and configuration based on measurement and analysis of solar panel power output.

FIG. 1 is a diagram illustrating an example of a system 100 for property control and configuration based on measurement and analysis of solar panel power output. The system 100 includes a property 102 that has solar panels 104 and 105 installed on the roof. The property 102 is monitored by a property monitoring system. The property 102 can be a home, another residence, a place of business, a public space, or another facility that has solar panels installed and is monitored by a property monitoring system. The monitoring system includes one or more sensors 112 located at the property 102 that collect sensor data related to the property 102.

The solar panels 104 and 105 are connected to the property monitoring system. The property monitoring system has the ability to notify the resident 118 of various anomalies on the property 102. The property monitoring system also has the ability to communicate with and control various devices on the property 102.

In stage (A) of FIG. 1, the power meter 106 measures solar panel power output from solar panels 104 and 105 to acquire solar panel power output data 109. The power output data is a measure of the power produced by the solar panels, typically measured in watts (W). In the example of FIG. 1, snow is falling and accumulating on solar panels 104 and 105. The accumulation of snow reduces the amount of solar energy collected by the solar panels 104 and 105. This causes the power output of the solar panels to decrease. The power output data indicates that the solar panel power output from solar panels 104 and 105 has decreased from 300 W to 200 W over 6 hours. The power meter 106 provides this data 109 to the control unit 116 through the network 120.

Concurrently or at another time, other sensors 112 of the monitoring system may collect sensor data and send the sensor data to the control unit 116. The sensors can include one or more surveillance cameras 108 that are in various locations of the property 102. The surveillance cameras 108 can capture various types of images or videos such as visual light images, thermal images, radar images, or sonic images. Surveillance cameras 108 can provide images of the physical surroundings detectable within the camera's field of view. In the example in FIG. 1, a surveillance camera 108 collects images of the yard of the property 102.

The sensors 112 can include thermometers that measure the indoor and/or outdoor temperature at the property 102. Sensors can also include motion detectors that sense movement in an area of the property 102. The sensors 112 can also include appliance sensors, door or window lock sensors, utility or resource usage sensors, microphones, humidity sensors, light detectors, or other sensors.

The control unit 116 receives the solar panel power output data 109 from the power meter 106 and the sensor data from the sensors 112. The control unit 116 can be, for example, a computer system or other electronic device configured to communicate with the power meter 106 and sensors 112. The control unit 116 can also perform various management tasks and functions for the monitoring system. In some implementations, there may be one or more solar panel control units connected directly to the solar panels. The solar panel control units can communicate to the monitoring server directly or through cloud-based communications instead of communicating with the monitoring server through the monitor control unit 116. In this instance, the solar panel control units may function similarly to the monitor control unit 116, and/or the solar panel control units communicate data related to the solar panels 104 and 105 while the monitor control unit 116 communicate data related to the property 102. In some implementations, the resident 118 of the property, or another user, can communicate with the control unit 116 (e.g., input data, view settings, or adjust parameters) through a physical connection, such as a touch screen or keypad, through a voice interface, or over a network connection.

The power meter 106 and sensors 112 may communicate with the control unit 116 through a network 120. The network 120 can be any communication infrastructure that supports the electronic exchange of data between the control unit 116, the power meter 106, and sensors 112. For example, the network 120 may include a local area network (LAN). The network 120 may be any one or combination of wireless or wired networks and may include any one or more of Ethernet, Bluetooth, Bluetooth LE, Z-wave, Zigbee, or Wi-Fi technologies.

In stage (B), the control unit 116 sends the various data 124 to a remote monitoring server 126, where the data 124 can include solar panel power output data 109 and sensor data from the sensors 112. The control unit 116 also sends the configuration of the system to the monitoring server 126, indicating what equipment is available to address or correct any deficiencies. There may be several automatic maintenance systems 107 associated with the solar panels. Possible automatic maintenance systems 107 include an automatic cleaning system that uses spray nozzles to clean the panels, an automatic snow melt system that uses heating coils to heat up the panels to melt snow, and an automatic tilt system that can adjust the angle of the solar panels. Additionally, there may be a robotic drone 110 connected to the monitoring system. One or more drones 110 can be capable of moving throughout a property based on automated control technology and/or user input control provided by a user. In this example, the drones 110 may be able to fly around the property, and can include attachments such as heat radiators or water spray nozzles that can be used to assist with melting snow or cleaning solar panels.

The monitoring server 126 may be, for example, one or more computer systems, server systems, or other computing devices that are located remotely from the property 102 and that are configured to process information related to the monitoring system at the property 102. In some implementations, the monitoring server 126 is a cloud computing platform.

The control unit 116 communicates with the monitoring server 126 via a long-range data link. The long-range data link can include any combination of wired and wireless data networks. For example, the control unit 116 can exchange information with the monitoring server 126 through a wide-area-network (WAN), a broadband internet connection, a cellular telephony network, a wireless data network, a cable connection, a digital subscriber line (DSL), a satellite connection, or other electronic means for data transmission. The control unit 116 and the monitoring server 126 may exchange information using any one or more of various communication synchronous or asynchronous protocols, including the 802.11 family of protocols, TCP/IP, GSM, 3G, 4G, 5G, LTE, CDMA-based data exchange or other techniques. In some implementations, the long-range data link between the control unit 116 and the monitoring server 126 is a secure data link (e.g., a virtual private network) such that the data exchanged between the unit 116 and the server 126 is encoded to protect against interception by an adverse third party.

In some implementations, various other monitoring system components located at the property 102 communicate directly with the monitoring server 126 (e.g., sending data directly to the monitoring server 126 rather than sending data to the server 126 via the control unit 116). For example, the power meter 106, the sensors 112, the automation controls 122, or other devices at the property 102 can provide some or all of the data 124 to the monitoring server 126, e.g., through an internet connection.

In some implementations, the control unit 116 processes some or all of the data 124 before sending the data 124 to the monitoring server 126. For example, the control unit 116 may compress or encode the solar panel power output data 109 to reduce the bandwidth required to support data transmission. The control unit 116 can also aggregate, filter, transform, or otherwise process some or all of the data 124.

In the example of FIG. 1, the data 124 includes solar panel power output data 109 indicating decreasing power output, surveillance camera 108 imagery of the yard of the property 102, and sensor data from an outdoor thermometer indicating that the current temperature is 26° F. The control unit may also send information to the monitoring server 126 indicating that the automatic snow melt system is installed and functional.

The communication between the control unit and the monitoring server can be two-way communication. When the monitoring server 126 receives the data from the control unit 116, it can determine if there is any missing information. For example, if there is no outdoor temperature data provided, the monitoring server can ask the control panel to provide the missing information from one of the sensors 112, such as the thermometer. If the control unit 116 still does not send the requested information, the monitoring server 126 may be able to download the information from another source, such as the internet. In another example, the control unit 116 may send information to the monitoring server that the automatic snow melt system is not functional. The monitoring server may then ask the control unit 116 to send status information on other equipment, such as a heat radiating drone 110.

The monitoring server may also obtain data from related systems. For example, the property 102 may not have a surveillance camera, but a neighboring property may have a surveillance camera. If both properties have a property monitoring system that is installed and monitored by the same company, they might communicate with the same monitoring server. In this case, the monitoring server may be able to obtain image or video data from the neighboring camera.

In stage (C), the monitoring server 126 analyzes the data 124 received from the control unit 116 to determine if there are any anomalies, and if so, to determine the cause of the anomalies. The monitoring server 126 analyzes the solar panel power output data 109 included in the data 124 to determine if there is a deviation, e.g., a decrease, in power output. The monitoring server 126 can use a machine-learning based system 129 or a rules-based system 127 to identify the cause of performance loss.

Many factors affect the power output of solar panels. Solar panels produce more power when there is more direct sunlight. Thus, solar panels produce more power during the day than in the evening or at night, and produce more power in the summer than in the winter. The angle of sunlight incidence on the solar panels affect their power output as well. A solar panel that is facing the sun produces more power than a solar panel that is tilted away from the sun. Another factor that affects solar panel performance is age. Solar panels are expected to degrade over time. After many years of operation, solar panels will reach the end of their useful life and will need to be replaced due to inefficiency and low power output.

Another factor that may affect solar panel output is debris on solar panels. Solar panels covered in pollen or dirt will produce less power. Solar panels covered in snow may not produce any power. Other objects may also land on panels and decrease power output, such as branches and leaves. If large objects fall on solar panels, the panels may be damaged and produce less power, or no power at all. Many other factors can affect solar panel power output, such as geographic location, altitude, atmospheric conditions, temperature, precipitation, cloud cover, and shade from nearby structures.

The monitoring server 126 uses a mathematical model 125 to determine whether or not power outputted by the solar panel has deviated from an expected power range. The mathematical model 125 calculates expected power output values based on input data related to known factors such as geographic location, solar panel age, solar panel tilt angle, season, and time of day. The mathematical model 125 also factors in variables such as weather conditions, e.g., atmospheric conditions, cloud cover, precipitation, and temperature. Based on the mathematical model 125, the monitoring server 126 estimates the expected power output for each solar panel 104 and 105.

The mathematical model 125 may be a multivariate linear regression, considering time, weather, and temperature features to estimate the electrical output of the panel. The output of the panel should vary with panel temperature, and can be reasonably approximated by a linear model, with higher temperatures resulting in lower power output. The angle of light to the surface of the solar panel also may have an approximately linear effect on the panel power output. Other modeling methods could be used instead of or in addition to a linear model. Examples of other modeling methods that may be used are neural networks, support vector machines, and nearest-neighbor interpolations.

Once a mathematical model 125 is trained to take input data and predict solar panel output, the coefficients of the mathematical model 125 embody underlying solar panel efficiency. For example, the coefficient related to temperature indicates how quickly the panel performance drops off as the panel temperature increases. Different mathematical models 125 given the same input data to produce differing outputs will convey information of relative panel performance.

After the mathematical model 125 calculates the expected solar panel power output, the monitoring server 126 compares the model-estimated power output to the actual power output data 109 measured by the power meter 106. The monitoring server 126 can also compare current solar panel power output with past power output to determine if there has been a change over time. The monitoring server 126 can also compare current power output of one solar panel to other solar panels nearby, to determine if there are any anomalies with a single panel or group of panels. This may include comparing individual solar panels installed on the same property. It may also include comparing solar panels installed on various properties within a neighborhood or town that are made by the same manufacturer and/or communicate with the same monitoring server. Additionally, the monitoring server can track solar panel power output over a long period of time to determine when a solar panel has reached the end of its life.

To determine the cause of a decrease in solar panel power output, the monitoring server 126 analyzes sensor and/or monitoring data included in the data 124 provided by the control unit 116 to determine one or more conditions of the property 102. For example, the server 126 can analyze date and time information, images from the surveillance camera 108, and the recent, current, and future weather data to identify the cause of any change in the power output of solar panels 104 and 105.

In the example of FIG. 1, the server 126 analyzes the surveillance camera imagery to determine that snow is accumulating in the yard of the property 102. The server 126 also analyzes the current weather data indicating that snow has been falling for the past 6 hours, and the thermometer-measured temperature of 26° F., to conclude that snow is likely accumulating on the solar panels 104 and 105. The monitoring server evaluates the future forecast of clear skies, and temperature of 24° F., to determine that the snowfall will soon be stopping, and the accumulated snow is not likely to melt on its own. The monitoring server can also evaluate the camera images to approximate the depth of snow on the yard. From this information, the monitoring server can estimate the depth of snow on top of the solar panels 104 and 105.

In some implementations, the server 126 includes one or more machine learning modules to analyze the data 124, generate the rules 127, generate the thresholds 128, and/or determine the actions 130. For example, the server 126 can include one or more neural networks, linear or logistic regression models, decision trees, support vector machines, Bayesian techniques, nearest-neighbor or clustering techniques, or other machine learning approaches. The machine learning modules of server 126 may support supervised and/or unsupervised learning.

In some implementations, the machine learning modules may support supervised learning using labeled training data.

The labeled training data can, for instance, be solar panel power output data 109 acquired by the power meter 106, where the solar panel power output data 109 has been labeled by the resident 118, by another user, or by a computer-implemented algorithm. The training data may be labeled to indicate that certain solar panel power output data 109 corresponds to a solar panel 104 or 105 in its usual or default state. Additionally, training data can be provided that corresponds to solar panels 104 and 105 in various degraded conditions, such as when covered in snow or pollen, or when tilted at a non-optimal angle.

In stage (D), in response to determining the cause of a decrease in solar panel power output, the monitoring server 126 determines one or more system actions 130 based on the available automatic systems 107. The server 126 can include a rules engine which determines the system actions 130 based on one or more rules 127. The rules 127 can be default rules, set in advance by a system administrator. The rules 127 can also be custom rules, set or modified by the resident 118 or another authorized user of the monitoring system. The rules 127 may be general, such that they are applied to more than one property, or they may be specific to the particular property 102. In some implementations, the rules 127 can be customized according to the particular area of the property 102, the time of day, or other factors.

In some implementations, the rules 127 can be adjusted based on the analyzed data 124. For example, if the weather forecast indicates that the temperature will rise to 45° F. within the next 12 hours, the rule for activating the automatic snow melt system may be changed so that energy is not wasted to melt the snow. Additionally, if the snow is approximated to be several feet deep based the analysis of surveillance camera 108 images and external weather data, the rules 127 may be adjusted based on this data. The rules 127 may be adjusted to activate the automatic snow melt system regardless of the temperature forecast, and/or to activate the automatic snow melt system and the heat radiating drone 110 simultaneously.

In some implementations, the rules 127 include one or more thresholds 128, where a threshold 128 can relate to a percentage decrease of solar panel power output, a power level deviation from the expected power range, or a rate of change in solar panel power output. In the example of FIG. 1, the rules 127 indicate that if the power output of solar panels 104 and 105 decreases by more than 50 W due to snow, and the snow is unlikely to melt on its own due to temperatures remaining less than 32° F., the server 126 activates the automatic snow melt system, if installed and functional. In the absence of an automatic snow melt system, the server 126 should send a notification 136 to the mobile device 132 of the resident 118 recommending that the resident 118 use a rake 134 to remove the snow from the roof of the property 102.

In some implementations, the rules 127 may indicate that the power output of solar panels 104 and 105 must satisfy the threshold 128 for a particular time period in order for the monitoring server 126 to perform the one or more actions 130. For example, the rules 127 may indicate that the monitoring server 126 should activate the automatic snow melt system or send a notification 136 to the mobile device 132 if the solar panel power output is more than 50 W below normal for more 24 hours. Alternatively, the rules may indicate that if the solar panel power output returns to within 25 W of normal levels within 12 hours, no action will be taken.

In some implementations, the monitoring server 126 may adjust the time period associated with a particular threshold 128 based on analyzing the data. For example, the server 126 may set the time period associated with the threshold 128 to one value when the current outdoor temperature is more than 32° F., and to a second, different value when the current outdoor temperature less than 32° F. In the example of FIG. 1, the server 126 may set the time period associated with the threshold 128 to a relatively long time period (e.g., 48 hours) when the current outdoor temperature is more than 32° F., and a shorter time period (e.g., 24 hours) when the current outdoor temperature less than 32° F. When the temperature is greater than 32° F., the snow is likely to melt on its own, and the server can conserve energy by not activating the automatic snow melt system. When the temperature is less than 32° F., the snow is not likely to melt without assistance, and the server can decide to activate the automatic melt system earlier to increase the power output of the solar panels 104 and 105 sooner.

In some implementations, the resident 118 can customize the one or more rules 127 and thresholds 128 according to his preferences. In some implementations, the resident 118 can set the one or more rules 127 and/or thresholds 128 through a software application executing on his mobile device 132, through a graphical interface provided by a browser or application on a computing device, and/or through interacting with a physical interface of the control unit 116 of the property monitoring system. In some implementations, the rules 127 can be executed on the server or communicated to the control unit 116 to be executed by the control unit 116.

The server 126 can determine any of various actions 130 in response to analyzing the data 124. For example, the server 126 may determine actions 130 that include sending a notification 136 to a mobile device 132 of the resident 118, sending an instruction to the automation controls 122 to adjust a setting of a connected automatic maintenance system 107, sending a command to a sensor 112 to collect and send additional sensor data, sounding an alarm of the property 102, or sending an alert to a third-party, such as security personnel or emergency services.

In stage (E), the server 126 performs the system actions 130. For example, the server 126 can perform the actions 130 by sending a command to a device of the monitoring system through a signal to the control unit 116 over the long-range data link. In some implementations, the server 126 can send a notification 136 and/or alert to the mobile device 132 of the resident 118. The server 126 can communicate with the mobile device 132 through a cellular telephony or wireless data network, through a WAN or LAN, through Wi-Fi, or through another wired or wireless communication link. The notification 136 can be, for example, an SMS text message, an e-mail, a message displayed by an application executing on the mobile device 132, or another notification 136 or message sent to the device 132.

The control unit 116 can also activate one or more property automation controls 122, possibly through the network 120. The property automation controls 122 connect to one or more devices of the property 102 and enable control of various property actions. For example, the property automation controls 122 can activate automatic maintenance systems 107, reposition one or more surveillance cameras 108, adjust a setting on a thermostat, disable one or more appliances, secure a door lock, or control other devices of the property 102.

In the example of FIG. 1, the server 126 performs the actions 130 by sending the notification 136 to the mobile device 132 of the resident 118 and by sending an instruction to the control unit 116 to use the automation controls 122 to activate the automatic snow melt system for the solar panels 104 and 105. In response to receiving the instruction, the automatic snow melt system can energize a heating element, e.g., heating coils, causing snow to melt.

In some implementations, the actions 130 may include sending a message to the mobile device 132 of the resident 118 and requesting a response from the resident 118. For example, the monitoring server 126 can send a message to the mobile device 132 requesting permission to adjust the configuration of an automation control 122. The server 126 can wait until it receives an affirmative response from the resident 118 (e.g., an affirmative response sent from the mobile device 132 of the resident 118) before adjusting the configuration of the particular automation control 122.

The resident 118 can interact with the monitoring system in other ways, as well. For example, after the monitoring server 126 activates an automatic maintenance system, the resident 118 can provide feedback to the system as to whether the problem is fixed. In the example of FIG. 1, the resident 118 can provide feedback to the monitoring system indicating that the snow is cleared, or that there remains some snow on the roof.

In addition to feedback from the resident 118, the monitoring system can obtain feedback from the sensors 112. For example, if the automatic snow melt system is activated, the heating element energizes, causing snow to melt. The power meter 106 may then measure an increase in solar panel power output. Based on the increase in solar panel power output, the server 126 can determine that the automatic action 130 is working as intended. The server 126 can use this data to determine when to deactivate automatic maintenance systems 107. For example, when the outputted power level returns within a threshold deviation from the expected power range, the server 126 can determine to deactivate the automatic snow melt system. If the sensor feedback indicates that the automatic action 130 is not functioning, the server can use this data to decide to activate additional automatic systems 107 or to send an additional notification 136 to the resident 118.

Though described above as being performed by a particular component of system 100 (e.g., the control unit 116 or the monitoring server 126), any of the various control, processing, and analysis operations can be performed by the control unit 116, the monitoring server 126, or another computer system of the system 100. For example, the control unit 116, the monitoring server 126, or another computer system can analyze the solar panel power output data 109 and sensor data 112 to determine the actions 130. Similarly, the control unit 116, the monitoring server 126, or another computer system can control the various sensors 112, the power meter 106, and/or the property automation controls 122 to collect data or control device operation.

Figure 2A:
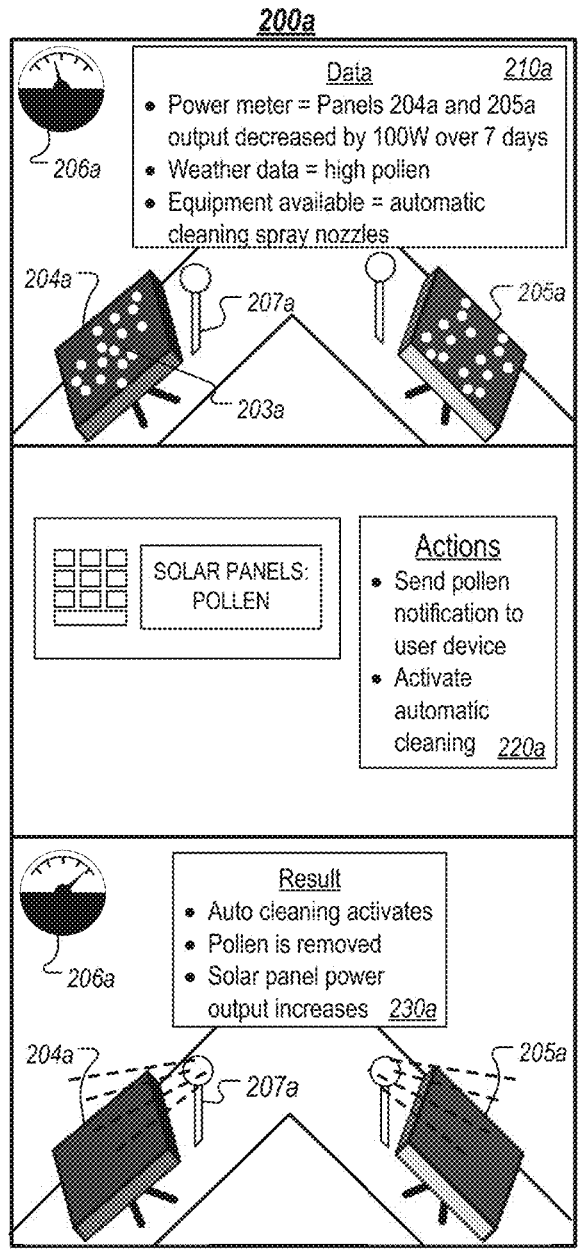
FIGS. 2A and 2B are diagrams illustrating examples of property control and configuration based on measurement and analysis of solar panel power output.
Figure 2B:
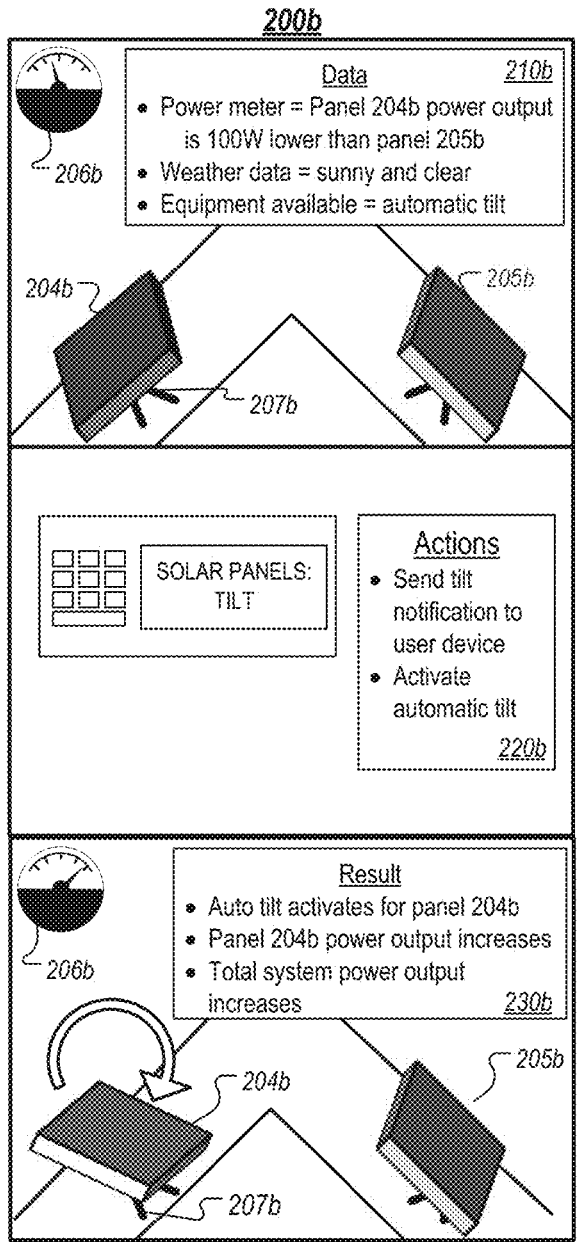

FIGS. 2A and 2B are diagrams illustrating examples of property control and configuration based on measurement and analysis of solar panel power output. FIG. 2A illustrates the system response to pollen 203a accumulating on solar panels 204a and 205a. In this example, the monitoring system is connected to an automatic cleaning system that can apply a cleaning solution to the solar panels 204a and 205a. For example, spray nozzles 207a can spray the cleaning solution, e.g., water, onto the solar panels 204a and 205a to remove pollen 203a or other debris.

In the example in FIG. 2A, the power meter 206a measures a decrease of 100 W in the power output of solar panels 204a and 205a over the course of 7 days. External information systems indicate that there have recently been high levels of pollen in the atmosphere. The monitoring server processes the data 210a and determines that the solar panels likely have had a decrease in power output due to pollen accumulating on top of the panels.

The monitoring server can determine the appropriate system actions 220a based on available systems. In the example of FIG. 2A, an automatic cleaning system is available to solve the problem of pollen buildup by spraying water from spray nozzles. The monitoring server can send a signal to the control unit to activate the automatic cleaning system, and can also send a notification to the control unit display and the resident's mobile device that the automatic cleaning system has been activated. Alternatively, based on the settings and preferences of the user, the monitoring server can send a request to the resident to activate the automatic cleaning system, and wait for an affirmative response from the resident before activating the automatic cleaning system. If there was not an automatic cleaning system available, such as if it was not installed or not functional, the monitoring server could send a notification to the resident that recommends manually cleaning the solar panels 204a and 205a with a hose.

In the example of FIG. 2A, the results 230a of the actions 220a taken by the monitoring system are that the automatic cleaning system sprays water from the spray nozzles 207a onto the solar panels 204a and 205a, removing the pollen. The power meter 206a then measures an increase in the total power output of the solar panels 204a and 205a. For example, the power outputted by the solar panels 204a and 205a may return within a threshold deviation from the expected power range. In response to determining that the power outputted by the solar panels 204a and 205a has returned within the threshold deviation from the expected power range, the monitoring server may deactivate the automatic cleaning system. The automatic cleaning system then ceases spraying the water from the spray nozzles 207a.

FIG. 2B illustrates the system response to a non-optimal solar panel tilt angle. In this example, the monitoring system is connected to an automatic tilt system 207b that can change the angle of each solar panel. The automatic tilt system 207b can be used to adjust the tilt of solar panels 204b and 205b to increase the power output.

In this implementation, the power meter 206b measures that solar panel 204b power output is consistently 100 W lower than solar panel 205b power output, and therefore the total power output of the system is less than the power output predicted by the mathematical model. The monitoring server determines that there are no current weather effects affecting solar panel 204b. Based on time, date, and location information, combined with power output data, the monitoring server determines that solar panel 205b is tilted at an optimal angle to the sun, while solar panel 204b is tilted at a non-optimal angle.

The monitoring server determines the appropriate system actions 220b based on available systems. In the example of FIG. 2B, the server determines that the automatic tilt system 207b is available to correct the performance deficiency by tilting solar panel 204b to the optimal angle. The monitoring server can send a signal to the control unit 116 to activate the automatic tilt system 207b, and can also send a notification to the user device that the automatic tilt system 207b has been activated. If an automatic tilt system is not available, the monitoring server can take the action of sending a notification to the resident that recommends manually tilting solar panel 204b.

In the example of FIG. 2B, the result 230b of the actions 220b taken by the monitoring server are that the automatic tilt system 207b adjusts the tilt of solar panel 204b, optimizing the angle to the sun. The power meter 206b then measures an increase in the power output of solar panel 204b, and an increase in the total power output of the solar panels 204a and 205a to approximately the value predicted by the mathematical model. For example, the power outputted by the solar panels 204a and 205a may return within a threshold deviation from the expected power range. In response to determining that the power outputted by the solar panels 204a and 205a has returned within the threshold deviation from the expected power range, the monitoring server may deactivate the automatic tilt system. The automatic tilt system then ceases adjusting the tilt of the solar panel 204b.

Figure 3A:
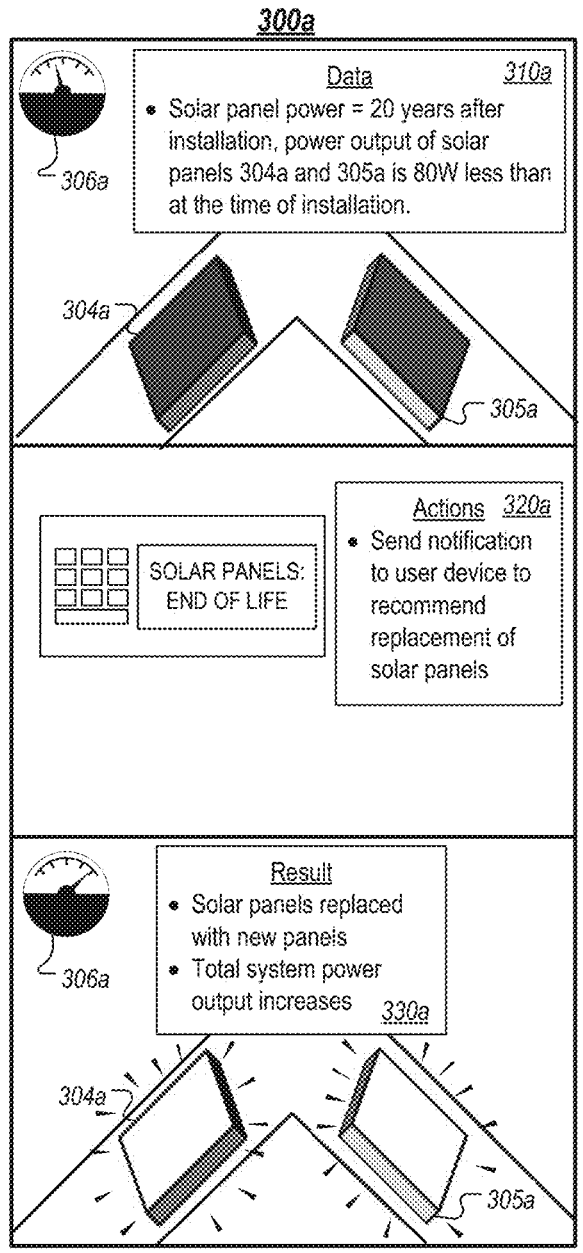
FIGS. 3A and 3B are diagrams illustrating additional examples of property control and configuration based on measurement and analysis of solar panel power output.
Figure 3B:
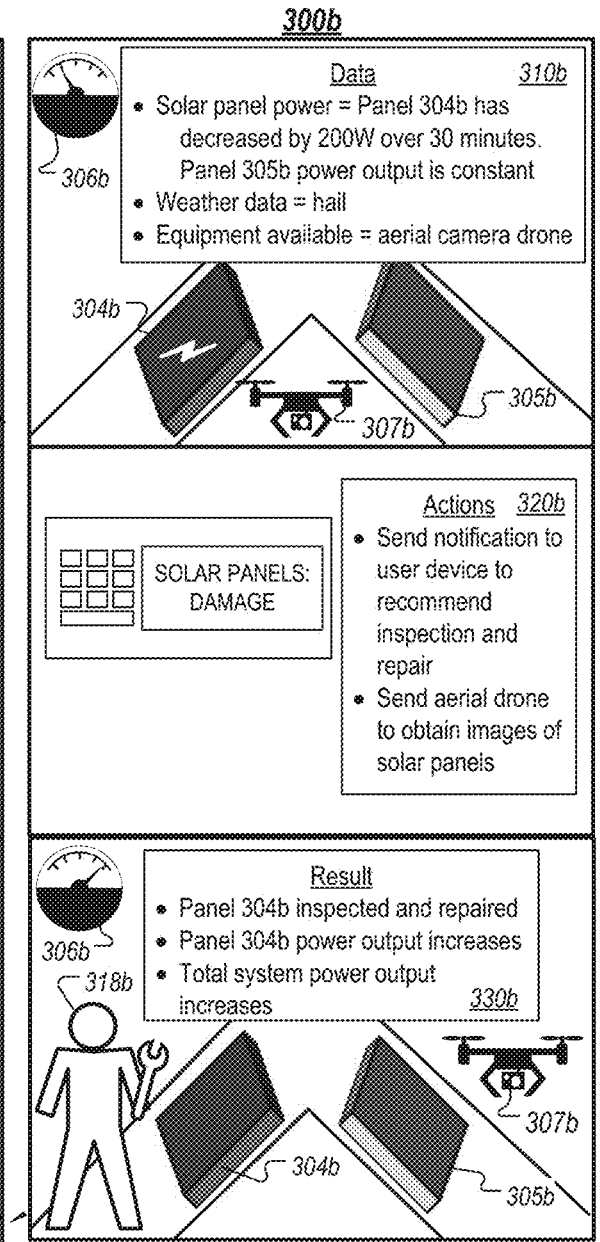

FIGS. 3A and 3B are diagrams illustrating additional examples of property control and configuration based on measurement and analysis of solar panel power output. FIG. 3A illustrates the system response to aging solar panels 304a and 305a.

In this example, 20 years after installation, the power meter 306a measures the power output of each solar panel 304a and 305a is consistently 80 W less than the power output at the time of installation. The monitoring server processes the data 310a to determine the cause of the performance deficiency. There are no weather impacts or indications of damage. Based on the age of the panels, the consistently low power output, and the approximately equal power output levels of solar panels 304a and 305a, the monitoring server determines that the decrease in power output is likely due to the age of the solar panels 304a and 305a.

The monitoring system determines the appropriate system actions 320a. In the example of FIG. 3A, the system determines that the aged solar panels 304a and 305a should be replaced. The monitoring server sends a notification to the user device and to the control unit 116 display to recommend replacing the solar panels 304a and 305a.

In the example of FIG. 3A, the result 330a of the actions 320a taken by the monitoring system are that the resident replaces the solar panels 304a and 305a. The power meter 306a then measures an increase in the total power output of the solar panels 304a and 305a.

FIG. 3B illustrates the system response to a damaged solar panel. In this example, the power meter 306b measures that the power output of solar panel 304b has decreased by 200 W over the course of 30 minutes, while the power output of solar panel 305b has remained constant. External information systems indicate an ongoing hailstorm. The monitoring server processes the data 310b and determines that solar panel 304b is likely damaged due to hail.

The monitoring server determines the appropriate system actions 320b based on available systems. In the example of FIG. 3B, the server determines that an aerial drone 307b with a camera attachment is available to collect images of solar panel 304b in order to inspect solar panel 304b for damage. The monitoring server can send a notification to the user device that the aerial drone will be launched to inspect for damage. The monitoring server can monitor current weather data and wait to launch the aerial drone until after the hailstorm has passed. After the aerial drone 307b obtains images of the solar panels 304b and 305b, the images can be sent to the monitoring server for analysis. The monitoring server can analyze the data to determine the likelihood that solar panel 304b is damaged. Alternatively, the aerial drone 307b can send the images to the mobile device of the user, allowing the user to determine if solar panel 304b is damaged. If an aerial drone is not available, the server can send a notification to the resident's mobile device recommending that the resident manually inspect the solar panels 304b and 305b for damage.

In the example of FIG. 3B, the result 330b of the actions 320b taken by the monitoring system are that the aerial drone 307b inspects the solar panels 304b and 305b for damage, and the resident 318b repairs solar panel 304b. The power meter 306b then measures an increase in the total power output of the solar panels 304b and 305b.

Figure 4:
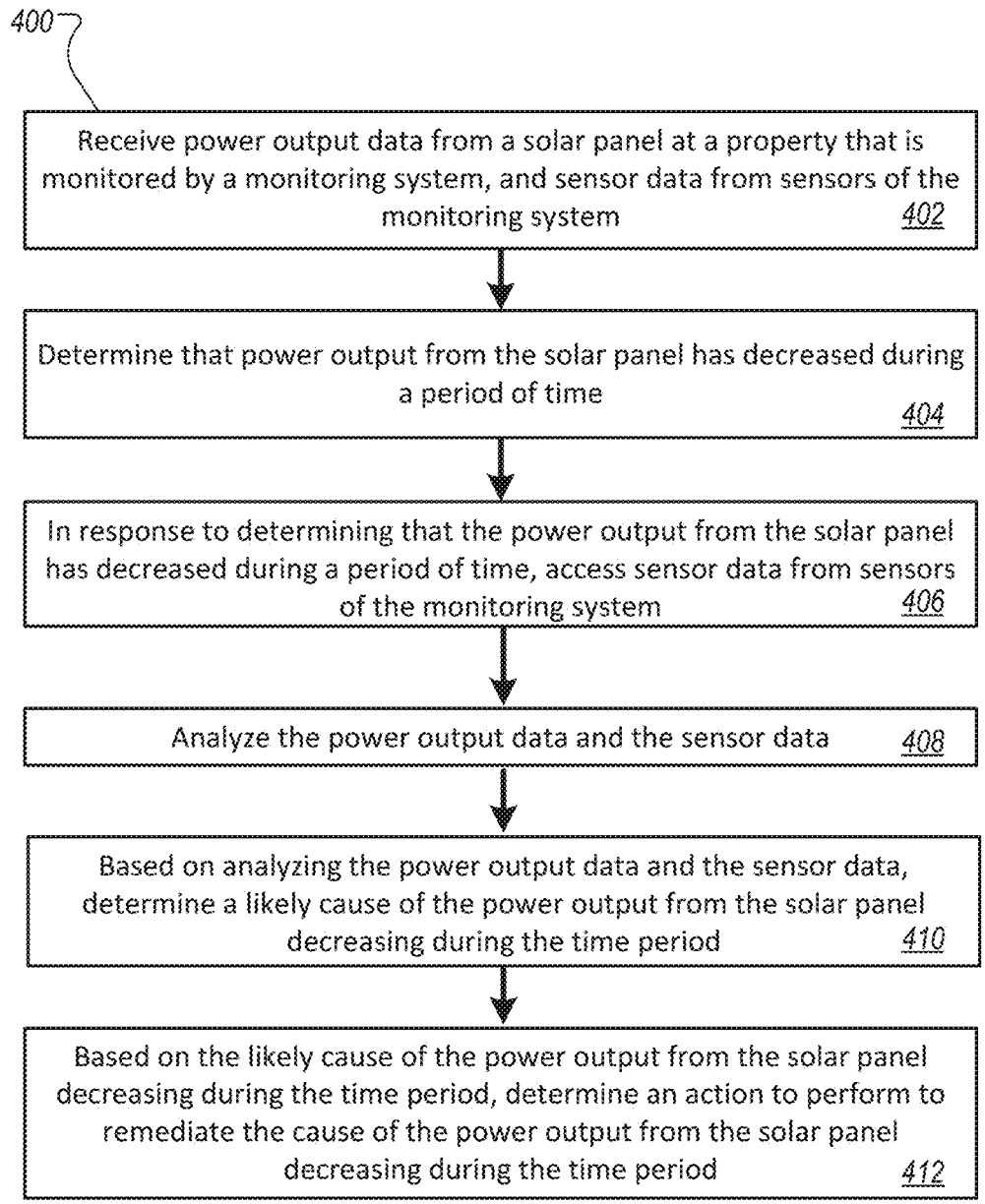
FIG. 4 is a flow chart illustrating an example of a method for property control and configuration based on measurement and analysis of solar panel power output.

FIG. 4 is a flow chart illustrating an example of a method for property control and configuration based on measurement and analysis of solar panel power output.

Method 400 can be performed by one or more computer systems, for example, the monitoring server 126 of system 100. In some implementations, some or all of the method can be performed by the control unit 116 of the system 100, or by another computer system located at the monitored property. In general, the method 400 collects power output data from a solar panel and sensor data from sensors. The method 400 determines if there was a decrease in solar panel power output, and if so, determines a likely cause of the decrease in power output. Based on the likely cause of the decrease in power output, the method 400 determines an action to perform to remediate the cause of the decrease in power output.

In more detail, the monitoring server or another computer system receives power output data from a solar panel at a property that is monitored by a monitoring system, and sensor data from sensors of the monitoring system (402). The power output data is a measure of the power produced by the solar panels, typically measured in watts. In some implementations, the monitoring server is remote from the property and a control unit located at the property sends the solar panel power output data to the monitoring server over a long-range data link.

The server or other computer system analyzes the solar panel power output data and may determine that power output from the solar panel has decreased during a period of time (404). For instance, the server can process the solar panel power output data to identify if there was a decrease in power output. The server uses a mathematical model to determine whether or not the change in solar panel power output is abnormal, or if it can be explained by predictable and known factors such as sunset or a change in seasons. The mathematical model calculates expected power output values based on factors such as geographic location, solar panel age, solar panel tilt angle, season, and time of day. The mathematical model also accounts for variables such as atmospheric conditions, cloud cover, precipitation, and temperature.

In response to determining that the power output from the solar panel has decreased during a period of time, the server accesses sensor data from sensors of the monitoring system (406). For example, the server may access surveillance camera imagery or temperature data from a thermometer. The server may also access data directly from the internet, such as weather data. Additionally, the server can access data from nearby or connected solar panel systems, such as those from neighboring properties. The monitoring systems of neighboring properties may be able to provide information that is missing from the initial data provided by the control unit.

The server analyzes the solar panel power output data and the sensor data (408). The server may also analyze other data provided by the monitoring system of the property, or by monitoring systems of nearby properties. For example, the server may analyze solar panel power output data in conjunction with other data collected by sensors located at the property, or with other monitoring system data, such as the monitoring system status, or a predicted location of a resident. The server may also access data regarding the automatic maintenance systems that may be installed on the property, and the functionality of each system. In some implementations, the server may include one or more machine learning modules that analyze the solar panel power output data and/or other data (e.g., sensor data or monitoring system data).

Based on analyzing the power output data and the sensor data, the server determines a likely cause of the power output from the solar panel decreasing during the time period (410). The decrease in power output may be due to the age of the panels, or may be due to a damaged panel or group of panels. Other causes of a decrease in solar panel power output can include snow accumulation on the panels, a non-optimal tilt angle, or debris on the panels, such as pollen.

Based on the likely cause of the power output from the solar panel decreasing during the time period, the server determines an action to perform to remediate the cause of the power output from the solar panel decreasing during the time period (412). To determine whether to take an action, the server compares the amount of the change and/or the rate of change of power output to a threshold. In some implementations, the threshold also includes an associated time period, such that the reduced power output of a solar panel must be below expected power output for the indicated associated time period for the threshold to be satisfied.

In some implementations, the threshold can be adjusted by a user. For example, a resident of the property can set a value for a threshold power output or time through an application on a personal mobile or non-mobile computing device. The threshold can be stored by a memory system of the server and accessed by the server. In some implementations, the threshold is included within one or more rules that the server applies to the analyzed solar panel power output data, where the one or more rules indicate one or more actions that the server should perform if the threshold is satisfied.

The server identifies the appropriate action to take based on the cause of the decrease in power output, and the availability of automatic maintenance systems that can remediate the cause. The server can determine the one or more actions based on one or more rules accessed by the server. In some implementations, the one or more rules may be set by a user, for instance, the resident may customize the rules using a software application on a computing device that communicates with the monitoring system.

The server can perform any of various actions to remediate the decrease in power output from the solar panels. For example, the server can send an instruction to a device of the property to perform an action, such as activating an automatic maintenance system. The server can also send a message to a mobile device of a user or resident, for example, a text message, an e-mail message, a push notification, a message through a software application, or another alert. In some implementations, the server may send a message to the mobile device of a user notifying the resident of an anomaly, requesting permission to perform another action of the monitoring system, and/or sending the resident a recommendation to take action. The server can also activate or change the operating mode of a sensor of the property, or sound an alarm of the property.

FIG. 5 is a table summarizing various causes of decreased solar panel power output, and the potential responses of the monitoring system.

If the cause of the decreased solar panel power output is snow accumulation, such as in scenarios S1, S2, S3, and S4, the monitoring system may take different actions based on the forecasted atmospheric temperature in the area. The time frame for the forecast may be set as a rule and/or may be adjusted by the user. For example, if the user would like the snow to melt within a day of the snowfall, the user can set the system preferences to consider the next 12 hours of forecasted temperature. In this case, based on weather information downloaded from the internet, if the forecasted temperature will rise above 32° F. within 12 hours, the system will take no action, since the snow will likely melt on its own. If the forecasted temperature is less than 32° F. for the next 12 hours, the server will choose an action based on the automatic maintenance systems that are available, such as heating coils or a heat radiating drone. If no automatic maintenance systems are available, the server may send a notification to a user device to recommend manual removal of the snow using a rake. If the user prefers to allow more time for the snow to melt on its own, the user can set the system preferences to look at another timeframe, such as the next 24 hours of forecasted temperature. In this case, if the temperature is forecasted to rise above 32° F. within 24 hours, the system will take no action.

Scenarios P1, P2, P3, and P4 demonstrate the possible actions of the monitoring system in response to a decrease in solar panel power output due to pollen accumulation. The monitoring system may take different actions based on the forecasted precipitation in the area. The time frame for the forecast may be set as a rule, or may be adjusted by the user. Based on weather information downloaded from the internet, if the forecasted precipitation is rain, the system may not take any action, since the pollen will likely be washed off by the rain. If there is no rain in the forecast, the server will choose an action based on the automatic maintenance systems that are available, such as water spraying nozzles or a water spraying drone. If no automatic maintenance systems are available, the server may send a notification to a user device to recommend manual removal of the pollen using a hose.

Scenarios N1 and N2 demonstrate the possible actions of the monitoring system in response to a decrease in solar panel power output due to a non-optimal angle. The server will choose an action based on the automatic maintenance systems that are available, such as an automatic tilt system. If no automatic maintenance systems are available, the server may send a notification to a user device to recommend manual tilting of the solar panels.

Scenario E1 demonstrates the possible actions of the monitoring server in response to a solar panel or group of solar panels reaching the end of life. In this case, there are no automatic systems that can be used to remediate the cause of the decrease in solar panel power output. The server will take the action to notify the user of the deficiency, and recommend replacement of the solar panel or panels.

Scenarios D1 and D2 demonstrate the possible actions of the monitoring server in response to a decrease in solar panel power output due to physical damage to the solar panel or panels. In this case, an inspection is likely necessary to determine the cause and extent of the damage. The server will choose an action based on the automatic maintenance systems that are available to perform an inspection, such as a camera drone. If no automatic maintenance systems are available, the server may send a notification to a user device to recommend inspecting the solar panels.

Figure 6:
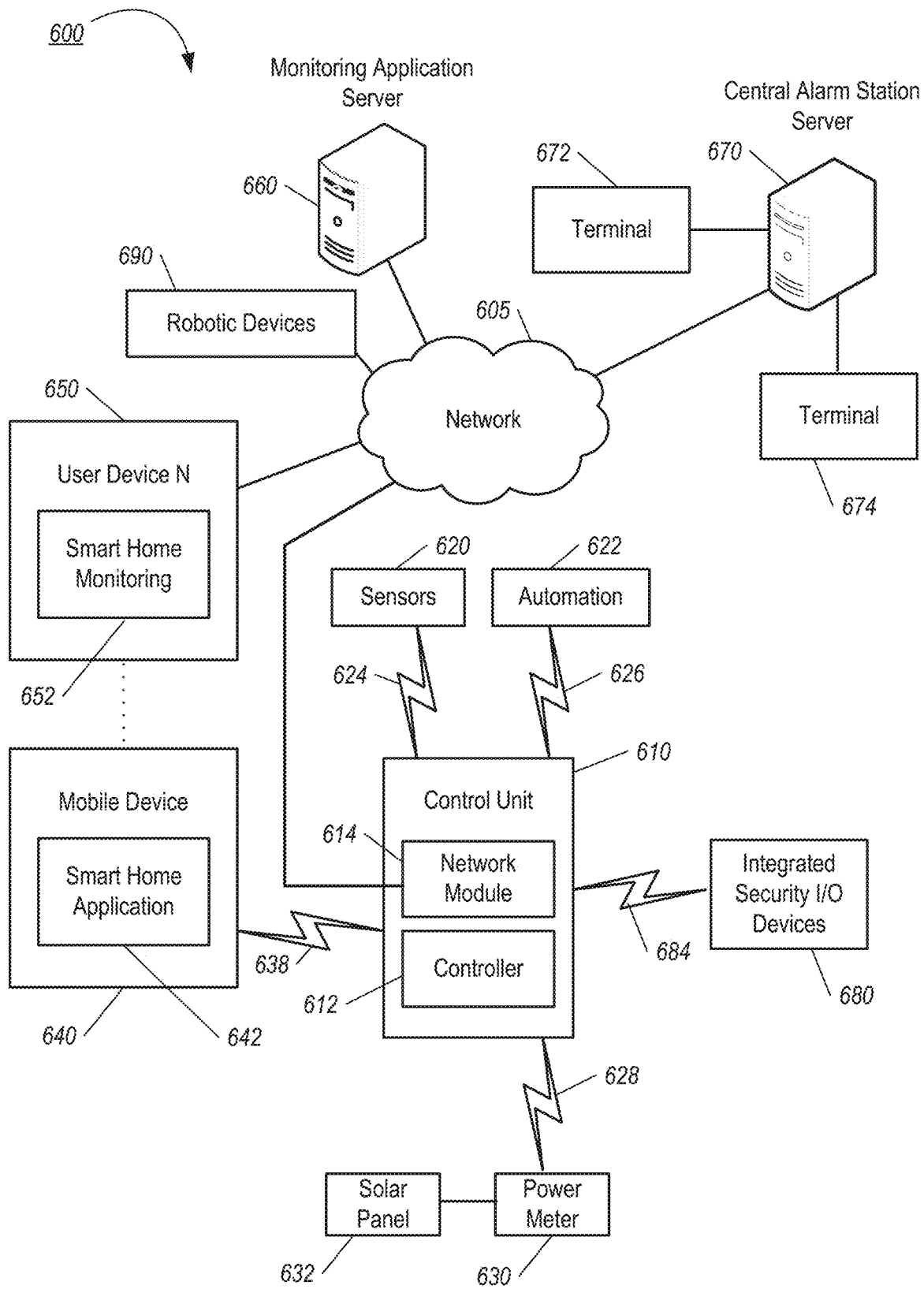
FIG. 6 is a diagram illustrating an example of a property monitoring system.

FIG. 6 is a diagram illustrating an example of a property monitoring system 600. The system 600 includes a network 605, a control unit 610, one or more user devices 640 and 650, a monitoring server 660, and a central alarm station server 670. In some examples, the network 605 facilitates communications between the control unit 610, the one or more user devices 640 and 650, the monitoring server 660, and the central alarm station server 670.

A solar panel 632 connects to the network 605 through a power meter 630. The power meter 630 measures the power output of the solar panel 632 and sends the information to the control unit 610.

The network 605 is configured to enable exchange of electronic communications between devices connected to the network 605. For example, the network 605 may be configured to enable exchange of electronic communications between the control unit 610, the one or more user devices 640 and 650, the monitoring server 660, and the central alarm station server 670. The network 605 may include, for example, one or more of the Internet, Wide Area Networks (WANs), Local Area Networks (LANs), analog or digital wired and wireless telephone networks (e.g., a public switched telephone network (PSTN), Integrated Services Digital Network (ISDN), a cellular network, and Digital Subscriber Line (DSL)), radio, television, cable, satellite, or any other delivery or tunneling mechanism for carrying data. The network 605 may include multiple networks or subnetworks, each of which may include, for example, a wired or wireless data pathway. The network 605 may include a circuit-switched network, a packet-switched data network, or any other network able to carry electronic communications (e.g., data or voice communications). For example, the network 605 may include networks based on the Internet protocol (IP), asynchronous transfer mode (ATM), the PSTN, packet-switched networks based on IP, X.25, or Frame Relay, or other comparable technologies and may support voice using, for example, VoIP, or other comparable protocols used for voice communications. The network 605 may include one or more networks that include wireless data channels and wireless voice channels. The network 605 may be a wireless network, a broadband network, or a combination of networks including a wireless network and a broadband network.

The control unit 610 includes a controller 612 and a network module 614. The controller 612 is configured to control a control unit monitoring system (e.g., a control unit system) that includes the control unit 610. In some examples, the controller 612 may include a processor or other control circuitry configured to execute instructions of a program that controls operation of a control unit system. In these examples, the controller 612 may be configured to receive input from sensors, power meters, or other devices included in the control unit system and control operations of devices included in the household (e.g., speakers, lights, doors, etc.). For example, the controller 612 may be configured to control operation of the network module 614 included in the control unit 610.

The network module 614 is a communication device configured to exchange communications over the network 605. The network module 614 may be a wireless communication module configured to exchange wireless communications over the network 605. For example, the network module 614 may be a wireless communication device configured to exchange communications over a wireless data channel and a wireless voice channel. In this example, the network module 614 may transmit alarm data over a wireless data channel and establish a two-way voice communication session over a wireless voice channel. The wireless communication device may include one or more of a LTE module, a GSM module, a radio modem, cellular transmission module, or any type of module configured to exchange communications in one of the following formats: LTE, GSM or GPRS, CDMA, EDGE or EGPRS, EV-DO or EVDO, UMTS, or IP.

The network module 614 also may be a wired communication module configured to exchange communications over the network 605 using a wired connection. For instance, the network module 614 may be a modem, a network interface card, or another type of network interface device. The network module 614 may be an Ethernet network card configured to enable the control unit 610 to communicate over a local area network and/or the Internet. The network module 614 also may be a voice band modem configured to enable the alarm panel to communicate over the telephone lines of Plain Old Telephone Systems (POTS).

The control unit system that includes the control unit 610 includes one or more sensors 620. For example, the monitoring system may include multiple sensors 620. The sensors 620 may include a lock sensor, a contact sensor, a motion sensor, or any other type of sensor included in a control unit system. The sensors 620 also may include an environmental sensor, such as a thermometer, a water sensor, a rain sensor, a wind sensor, a light sensor, a smoke detector, a carbon monoxide detector, an air quality sensor, etc.

The system 600 also includes one or more property automation controls 622 that communicate with the control unit 610 to perform monitoring. The property automation controls 622 are connected to one or more devices connected to the system 600 and enable automation of actions at the property. For instance, the property automation controls 622 may be connected to one or more lighting systems and may be configured to control operation of the one or more lighting systems. Also, the property automation controls 622 may be connected to one or more electronic locks at the property and may be configured to control operation of the one or more electronic locks (e.g., control Z-Wave locks using wireless communications in the Z-Wave protocol). Further, the property automation controls 622 may be connected to one or more appliances at the property and may be configured to control operation of the one or more appliances. The property automation controls 622 may include multiple modules that are each specific to the type of device being controlled in an automated manner. For example, the property automation controls 622 may control solar panel automatic maintenance systems, such as spray nozzles or a snow melt system. The property automation controls 622 may control the one or more devices based on commands received from the control unit 610. For instance, the property automation controls 622 may interrupt power delivery to a particular outlet of the property or induce movement of a smart window shade of the property.

In some examples, the system 600 includes one or more robotic devices 690. The robotic devices 690 may be any type of robot that are capable of moving and taking actions that assist in home monitoring. For example, the robotic devices 690 may include drones that are capable of moving throughout a property based on automated control technology and/or user input control provided by a user. In this example, the drones may be able to fly, roll, walk, or otherwise move about the property. The drones may include helicopter type devices (e.g., quad copters), rolling helicopter type devices (e.g., roller copter devices that can fly and/or roll along the ground, walls, or ceiling) and land vehicle type devices (e.g., automated cars that drive around a property). In some cases, the robotic devices 690 may be robotic devices 690 that are intended for other purposes and merely associated with the system 600 for use in appropriate circumstances. For instance, a robotic aerial drone may be associated with the monitoring system 600 as one of the robotic devices 690 and may be controlled to take action responsive to monitoring system events.

In some examples, the robotic devices 690 automatically navigate within a property. In these examples, the robotic devices 690 include sensors and control processors that guide movement of the robotic devices 690 within the property. For instance, the robotic devices 690 may navigate within the property using one or more cameras, one or more proximity sensors, one or more gyroscopes, one or more accelerometers, one or more magnetometers, a global positioning system (GPS) unit, an altimeter, one or more sonar or laser sensors, and/or any other types of sensors that aid in navigation about a space. The robotic devices 690 may include control processors that process output from the various sensors and control the robotic devices 690 to move along a path that reaches the desired destination and avoids obstacles. In this regard, the control processors detect walls or other obstacles in the property and guide movement of the robotic devices 690 in a manner that avoids the walls and other obstacles.

In addition, the robotic devices 690 may store data that describes attributes of the property. For instance, the robotic devices 690 may store a floorplan of a building on the property and/or a three-dimensional model of the property that enables the robotic devices 690 to navigate the property. During initial configuration, the robotic devices 690 may receive the data describing attributes of the property, determine a frame of reference to the data (e.g., a property or reference location in the property), and navigate the property based on the frame of reference and the data describing attributes of the property. Further, initial configuration of the robotic devices 690 also may include learning of one or more navigation patterns in which a user provides input to control the robotic devices 690 to perform a specific navigation action (e.g., fly to an upstairs bedroom and spin around while capturing video and then return to a home charging base). In this regard, the robotic devices 690 may learn and store the navigation patterns such that the robotic devices 690 may automatically repeat the specific navigation actions upon a later request.

In some examples, the robotic devices 690 may include data capture and recording devices. In these examples, the robotic devices 690 may include one or more cameras, one or more motion sensors, one or more microphones, one or more biometric data collection tools, one or more temperature sensors, one or more humidity sensors, one or more air flow sensors, and/or any other types of sensors that may be useful in capturing monitoring data related to the property and users at the property. The one or more biometric data collection tools may be configured to obtain data on solar panels such as image data when a panel may be physical damaged.

In some implementations, solar panel maintenance equipment may be mounted on one or more of the robotic devices 690. This can include spray nozzles to clean the solar panels, or heat radiators to melt snow from the panels. In some implementations, the robotic devices 690 may include output devices. In these implementations, the robotic devices 690 may include one or more displays, one or more speakers, and/or any type of output devices that allow the robotic devices 690 to communicate information to a nearby user.

The robotic devices 690 also may include a communication module that enables the robotic devices 690 to communicate with the control unit 610, each other, and/or other devices. The communication module may be a wireless communication module that allows the robotic devices 690 to communicate wirelessly. For instance, the communication module may be a Wi-Fi module that enables the robotic devices 690 to communicate over a local wireless network at the property. The communication module further may be a 900 MHz wireless communication module that enables the robotic devices 690 to communicate directly with the control unit 610. Other types of short-range wireless communication protocols, such as Bluetooth, Bluetooth LE, Z-wave, Zigbee, etc., may be used to allow the robotic devices 690 to communicate with other devices in the property. In some implementations, the robotic devices 690 may communicate with each other or with other devices of the system 600 through the network 605.

The robotic devices 690 further may include processor and storage capabilities. The robotic devices 690 may include any suitable processing devices that enable the robotic devices 690 to operate applications and perform the actions described throughout this disclosure. In addition, the robotic devices 690 may include solid state electronic storage that enables the robotic devices 690 to store applications, configuration data, collected sensor data, and/or any other type of information available to the robotic devices 690.

The robotic devices 690 can be associated with one or more charging stations. The charging stations may be located at predefined home base or reference locations at the property. The robotic devices 690 may be configured to navigate to the charging stations after completion of tasks needed to be performed for the monitoring system 600. For instance, after completion of a monitoring operation or upon instruction by the control unit 610, the robotic devices 690 may be configured to automatically fly to and land on one of the charging stations. In this regard, the robotic devices 690 may automatically maintain a fully charged battery in a state in which the robotic devices 690 are ready for use by the monitoring system 600.

The charging stations may be contact-based charging stations and/or wireless charging stations. For contact-based charging stations, the robotic devices 690 may have readily accessible points of contact that the robotic devices 690 are capable of positioning and mating with a corresponding contact on the charging station. For instance, a helicopter type robotic device 690 may have an electronic contact on a portion of its landing gear that rests on and mates with an electronic pad of a charging station when the helicopter type robotic device 690 lands on the charging station. The electronic contact on the robotic device 690 may include a cover that opens to expose the electronic contact when the robotic device 690 is charging and closes to cover and insulate the electronic contact when the robotic device is in operation.

For wireless charging stations, the robotic devices 690 may charge through a wireless exchange of power. In these cases, the robotic devices 690 need only locate themselves closely enough to the wireless charging stations for the wireless exchange of power to occur. In this regard, the positioning needed to land at a predefined home base or reference location in the property may be less precise than with a contact based charging station. Based on the robotic devices 690 landing at a wireless charging station, the wireless charging station outputs a wireless signal that the robotic devices 690 receive and convert to a power signal that charges a battery maintained on the robotic devices 690.

In some implementations, each of the robotic devices 690 has a corresponding and assigned charging station such that the number of robotic devices 690 equals the number of charging stations. In these implementations, the robotic devices 690 always navigate to the specific charging station assigned to that robotic device. For instance, a first robotic device 690 may always use a first charging station and a second robotic device 690 may always use a second charging station.

In some examples, the robotic devices 690 may share charging stations. For instance, the robotic devices 690 may use one or more community charging stations that are capable of charging multiple robotic devices 690. The community charging station may be configured to charge multiple robotic devices 690 in parallel. The community charging station may be configured to charge multiple robotic devices 690 in serial such that the multiple robotic devices 690 take turns charging and, when fully charged, return to a predefined home base or reference location in the property that is not associated with a charger. The number of community charging stations may be less than the number of robotic devices 690.

Also, the charging stations may not be assigned to specific robotic devices 690 and may be capable of charging any of the robotic devices 690. In this regard, the robotic devices 690 may use any suitable, unoccupied charging station when not in use. For instance, when one of the robotic devices 690 has completed an operation or is in need of battery charge, the control unit 610 references a stored table of the occupancy status of each charging station and instructs the robotic device 690 to navigate to the nearest charging station that is unoccupied.

The system 600 further includes one or more integrated security devices 680. The one or more integrated security devices may include any type of device used to provide alerts based on received sensor data. For instance, the one or more control units 610 may provide one or more alerts to the one or more integrated security input/output devices 680. Additionally, the one or more control units 610 may receive one or more sensor data from the sensors 620 and determine whether to provide an alert to the one or more integrated security input/output devices 680.

The sensors 620, the property automation controls 622, and the integrated security devices 680 may communicate with the controller 612 over communication links 624, 626, 628, and 684. The communication links 624, 626, 628, and 684 may be a wired or wireless data pathway configured to transmit signals from the sensors 620, the property automation controls 622, the power meter 630, and the integrated security devices 680 to the controller 612. The sensors 620, the property automation controls 622, the power meter 630, and the integrated security devices 680 may continuously transmit sensed values to the controller 612, periodically transmit sensed values to the controller 612, or transmit sensed values to the controller 612 in response to a change in a sensed value.

The communication links 624, 626, 628, and 684 may include a local network. The sensors 620, the property automation controls 622, the power meter 630, and the integrated security devices 680, and the controller 612 may exchange data and commands over the local network. The local network may include 802.11 "Wi-Fi" wireless Ethernet (e.g., using low-power Wi-Fi chipsets), Z-Wave, Zigbee, Bluetooth, "Homeplug" or other "Powerline" networks that operate over AC wiring, and a Category 5 (CAT5) or Category 6 (CAT6) wired Ethernet network. The local network may be a mesh network constructed based on the devices connected to the mesh network.

The monitoring server 660 is one or more electronic devices configured to provide monitoring services by exchanging electronic communications with the control unit 610, the one or more user devices 640 and 650, and the central alarm station server 670 over the network 605. For example, the monitoring server 660 may be configured to monitor events (e.g., alarm events) generated by the control unit 610. In this example, the monitoring server 660 may exchange electronic communications with the network module 614 included in the control unit 610 to receive information regarding events (e.g., alerts) detected by the control unit 610. The monitoring server 660 also may receive information regarding events (e.g., alerts) from the one or more user devices 640 and 650.

In some examples, the monitoring server 660 may route alert data received from the network module 614 or the one or more user devices 640 and 650 to the central alarm station server 670. For example, the monitoring server 660 may transmit the alert data to the central alarm station server 670 over the network 605.

The monitoring server 660 may store sensor data, solar panel power data, and other monitoring system data received from the monitoring system and perform analysis of the sensor data, solar panel power data, and other monitoring system data received from the monitoring system. Based on the analysis, the monitoring server 660 may communicate with and control aspects of the control unit 610 or the one or more user devices 640 and 650.

The monitoring server 660 may provide various monitoring services to the system 600. For example, the monitoring server 660 may analyze the sensor, solar panel power data, and other data to determine an activity pattern of a resident of the property monitored by the system 600. In some implementations, the monitoring server 660 may analyze the data for alarm conditions or may determine and perform actions at the property by issuing commands to one or more of the automation controls 622, possibly through the control unit 610.

The central alarm station server 670 is an electronic device configured to provide alarm monitoring service by exchanging communications with the control unit 610, the one or more mobile devices 640 and 650, and the monitoring server 660 over the network 605. For example, the central alarm station server 670 may be configured to monitor alerting events generated by the control unit 610. In this example, the central alarm station server 670 may exchange communications with the network module 614 included in the control unit 610 to receive information regarding alerting events detected by the control unit 610. The central alarm station server 670 also may receive information regarding alerting events from the one or more mobile devices 640 and 650 and/or the monitoring server 660.

The central alarm station server 670 is connected to multiple terminals 672 and 674. The terminals 672 and 674 may be used by operators to process alerting events. For example, the central alarm station server 670 may route alerting data to the terminals 672 and 674 to enable an operator to process the alerting data. The terminals 672 and 674 may include general-purpose computers (e.g., desktop personal computers, workstations, or laptop computers) that are configured to receive alerting data from a server in the central alarm station server 670 and render a display of information based on the alerting data. For instance, the controller 612 may control the network module 614 to transmit, to the central alarm station server 670, alerting data indicating that a sensor 620 detected motion from a motion sensor via the sensors 620. The central alarm station server 670 may receive the alerting data and route the alerting data to the terminal 672 for processing by an operator associated with the terminal 672. The terminal 672 may render a display to the operator that includes information associated with the alerting event (e.g., the lock sensor data, the motion sensor data, the contact sensor data, etc.) and the operator may handle the alerting event based on the displayed information.

In some implementations, the terminals 672 and 674 may be mobile devices or devices designed for a specific function. Although FIG. 6 illustrates two terminals for brevity, actual implementations may include more (and, perhaps, many more) terminals.

The one or more authorized user devices 640 and 650 are devices that host and display user interfaces. For instance, the user device 640 is a mobile device that hosts or runs one or more native applications (e.g., the smart home application 642). The user device 640 may be a cellular phone or a non-cellular locally networked device with a display. The user device 640 may include a cell phone, a smart phone, a tablet PC, a personal digital assistant ("PDA"), or any other portable device configured to communicate over a network and display information. For example, implementations may also include Blackberry-type devices (e.g., as provided by Research in Motion), electronic organizers, iPhone-type devices (e.g., as provided by Apple), iPod devices (e.g., as provided by Apple) or other portable music players, other communication devices, and handheld or portable electronic devices for gaming, communications, and/or data organization. The user device 640 may perform functions unrelated to the monitoring system, such as placing personal telephone calls, playing music, playing video, displaying pictures, browsing the Internet, maintaining an electronic calendar, etc.

The user device 640 includes a smart home application 642. The smart home application 642 refers to a software/firmware program running on the corresponding mobile device that enables the user interface and features described throughout. The user device 640 may load or install the smart home application 642 based on data received over a network or data received from local media. The smart home application 642 runs on mobile devices platforms, such as iPhone, iPod touch, Blackberry, Google Android, Windows Mobile, etc. The smart home application 642 enables the user device 640 to receive and process power and sensor data from the monitoring system.

The user device 650 may be a general-purpose computer (e.g., a desktop personal computer, a workstation, or a laptop computer) that is configured to communicate with the monitoring server 660 and/or the control unit 610 over the network 605. The user device 650 may be configured to display a smart home user interface 652 that is generated by the user device 650 or generated by the monitoring server 660. For example, the user device 650 may be configured to display a user interface (e.g., a web page) provided by the monitoring server 660 that enables a user to perceive data captured by the power meter 630 and/or reports related to the monitoring system. Although FIG. 6 illustrates two user devices for brevity, actual implementations may include more (and, perhaps, many more) or fewer user devices.

The smart home application 642 and the smart home user interface 652 can allow a user to interface with the property monitoring system 600, for example, allowing the user to view monitoring system settings, adjust monitoring system parameters, customize monitoring system rules, and receive and view monitoring system messages.

In some implementations, the one or more user devices 640 and 650 communicate with and receive monitoring system data from the control unit 610 using the communication link 638. For instance, the one or more user devices 640 and 650 may communicate with the control unit 610 using various local wireless protocols such as Wi-Fi, Bluetooth, Z-wave, Zigbee, HomePlug (ethernet over power line), or wired protocols such as Ethernet and USB, to connect the one or more user devices 640 and 650 to local security and automation equipment. The one or more user devices 640 and 650 may connect locally to the monitoring system and its sensors and other devices. The local connection may improve the speed of status and control communications because communicating through the network 605 with a remote server (e.g., the monitoring server 660) may be significantly slower.

Although the one or more user devices 640 and 650 are shown as communicating with the control unit 610, the one or more user devices 640 and 650 may communicate directly with the sensors 620 and other devices controlled by the control unit 610. In some implementations, the one or more user devices 640 and 650 replace the control unit 610 and perform the functions of the control unit 610 for local monitoring and long range/offsite communication.

In other implementations, the one or more user devices 640 and 650 receive monitoring system data captured by the control unit 610 through the network 605. The one or more user devices 640, 650 may receive the data from the control unit 610 through the network 605 or the monitoring server 660 may relay data received from the control unit 610 to the one or more user devices 640 and 650 through the network 605. In this regard, the monitoring server 660 may facilitate communication between the one or more user devices 640 and 650 and the monitoring system 600.

In some implementations, the one or more user devices 640 and 650 may be configured to switch whether the one or more user devices 640 and 650 communicate with the control unit 610 directly (e.g., through link 638) or through the monitoring server 660 (e.g., through network 605) based on a location of the one or more user devices 640 and 650. For instance, when the one or more user devices 640 and 650 are located close to the control unit 610 and in range to communicate directly with the control unit 610, the one or more user devices 640 and 650 use direct communication. When the one or more user devices 640 and 650 are located far from the control unit 610 and not in range to communicate directly with the control unit 610, the one or more user devices 640 and 650 use communication through the monitoring server 660.

Although the one or more user devices 640 and 650 are shown as being connected to the network 605, in some implementations, the one or more user devices 640 and 650 are not connected to the network 605. In these implementations, the one or more user devices 640 and 650 communicate directly with one or more of the monitoring system components and no network (e.g., Internet) connection or reliance on remote servers is needed.

In some implementations, the one or more user devices 640 and 650 are used in conjunction with only local sensors and/or local devices in a house. In these implementations, the system 600 includes the one or more user devices 640 and 650, the sensors 620, the property automation controls 622, the power meter 630, and the robotic devices 690. The one or more user devices 640 and 650 receive data directly from the sensors 620, the property automation controls 622, the power meter 630, and the robotic devices 690 (i.e., the monitoring system components) and sends data directly to the monitoring system components. The one or more user devices 640, 650 provide the appropriate interfaces/processing to provide visual surveillance and reporting.

In other implementations, the system 600 further includes network 605 and the sensors 620, the property automation controls 622, the power meter 630, and the robotic devices 690 are configured to communicate sensor and power data to the one or more user devices 640 and 650 over network 605 (e.g., the Internet, cellular network, etc.). In yet another implementation, the sensors 620, the property automation controls 622, the power meter 630, and the robotic devices 690 (or a component, such as a bridge/router) are intelligent enough to change the communication pathway from a direct local pathway when the one or more user devices 640 and 650 are in close physical proximity to the sensors 620, the property automation controls 622, the power meter 630, and the robotic devices 690 to a pathway over network 605 when the one or more user devices 640 and 650 are farther from the sensors 620, the property automation controls 622, the power meter 630, and the robotic devices 690. In some examples, the system leverages GPS information from the one or more user devices 640 and 650 to determine whether the one or more user devices 640 and 650 are close enough to the monitoring system components to use the direct local pathway or whether the one or more user devices 640 and 650 are far enough from the monitoring system components that the pathway over network 605 is required. In other examples, the system leverages status communications (e.g., pinging) between the one or more user devices 640 and 650 and the sensors 620, the property automation controls 622, the power meter 630, and the robotic devices 690 to determine whether communication using the direct local pathway is possible. If communication using the direct local pathway is possible, the one or more user devices 640 and 650 communicate with the sensors 620, the property automation controls 622, the power meter 630, and the robotic devices 690 using the direct local pathway. If communication using the direct local pathway is not possible, the one or more user devices 640 and 650 communicate with the monitoring system components using the pathway over network 605.

In some implementations, the system 600 provides end users with access to solar panel power output data captured by the power meter 630 to aid in decision making. The system 600 may transmit the solar panel power output data captured by the power meter 630 over a wireless WAN network to the user devices 640 and 650. Because transmission over a wireless WAN network may be relatively expensive, the system 600 can use several techniques to reduce costs while providing access to significant levels of useful visual information (e.g., compressing data, down-sampling data, sending data only over inexpensive LAN connections, or other techniques).

The described systems, methods, and techniques may be implemented in digital electronic circuitry, computer hardware, firmware, software, or in combinations of these elements. Apparatus implementing these techniques may include appropriate input and output devices, a computer processor, and a computer program product tangibly embodied in a machine-readable storage device for execution by a programmable processor. A process implementing these techniques may be performed by a programmable processor executing a program of instructions to perform desired functions by operating on input data and generating appropriate output. The techniques may be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; and in any case, the language may be a compiled or interpreted language. Suitable processors include, by way of example, both general and special purpose microprocessors. Generally, a processor will receive instructions and data from a read-only memory and/or a random-access memory. Storage devices suitable for tangibly embodying computer program instructions and data include all forms of non-volatile memory, including by way of example semiconductor memory devices, such as Erasable Programmable Read-Only Memory (EPROM), Electrically Erasable Programmable Read-Only Memory (EEPROM), and flash memory devices; magnetic disks such as internal hard disks and removable disks; magneto-optical disks; and Compact Disc Read-Only Memory (CD-ROM). Any of the foregoing may be supplemented by, or incorporated in, specially designed ASICs (application-specific integrated circuits).

It will be understood that various modifications may be made. For example, other useful implementations could be achieved if steps of the disclosed techniques were performed in a different order and/or if components in the disclosed systems were combined in a different manner and/or replaced or supplemented by other components. Accordingly, other implementations are within the scope of the disclosure.

What is claimed is:

1. A monitoring system that is configured to monitor a property, the monitoring system comprising:
    a sensor that is configured to generate sensor data that reflects an attribute of the property;
    a solar panel that is configured to generate and output power; and
    a monitor control unit that is configured to:
        monitor the power outputted by the solar panel;
        determine that the power outputted by the solar panel has deviated from an expected power range;
        based on determining that the power outputted by the solar panel has deviated from the expected power range, access the sensor data;
        based on the power outputted by the solar panel and the sensor data, determine a likely cause of the deviation from the expected power range; and
        determine an action to perform to remediate the likely cause of the deviation from the expected power range.

2. The monitoring system of claim 1, comprising:
    an automatic snow melt system comprising a heating element that is configured to transfer heat to the solar panel,
    wherein the monitor control unit is configured to:
        receive automatic snow melt system data indicating an availability of the automatic snow melt system;
        determine the likely cause of the deviation from the expected power range by determining that snow has likely accumulated on the solar panel;
        determine the action to perform to remediate the likely cause of the deviation from the expected power range by determining to activate the automatic snow melt system to melt the snow; and
        provide, for output to the automatic snow melt system, an instruction to activate the heating element.

3. The monitoring system of claim 2, wherein, after providing, for output to the automatic snow melt system, the instruction to activate the heating element, the monitor control unit is configured to:
   determine that the power outputted by the solar panel has returned to the expected power range; and
   based on determining that the power outputted by the solar panel has returned to the expected power range, provide, for output to the automatic snow melt system, an instruction to deactivate the heating element.

4. The monitoring system of claim 2, wherein:
   the sensor is a camera that is configured to generate image data; and
   the monitor control unit is configured to:
      determine that snow is present at the property by analyzing the image data; and
      determine that snow has likely accumulated on the solar panel based on determining that snow is present at the property.

5. The monitoring system of claim 1, comprising:
   an automatic snow melt system comprising a heating element that is configured to transfer heat to the solar panel; and
   a thermometer that is configured to generate temperature data that reflects an outdoor temperature at the property,
   wherein the sensor is a camera that is configured to generate image data;
   wherein the monitor control unit is configured to:
      determine that snow is present at the property by analyzing the image data;
      determine the likely cause of the deviation from the expected power range by determining that snow has likely accumulated on the solar panel based on determining that snow is present at the property;
      based on the temperature data, determine that the snow is likely to melt within a threshold period of time; and
      determine the action to perform to remediate the likely cause of the deviation from the expected power range by determining to bypass activating the heating element.

6. The monitoring system of claim 1, comprising:
   an automatic cleaning system that is configured to remove debris from the solar panel,
   wherein the monitor control unit is configured to:
      receive automatic cleaning system data indicating an availability of the automatic cleaning system;
      determine the likely cause of the deviation from the expected power range by determining that debris has likely accumulated on the solar panel;
      determine the action to perform to remediate the likely cause of the deviation from the expected power range by determining to activate the automatic cleaning system; and
      provide, for output to the automatic cleaning system, an instruction to activate the automatic cleaning system.

7. The monitoring system of claim 6, wherein, after providing, for output to the automatic cleaning system, the instruction to activate the automatic cleaning system, the monitor control unit is configured to:
   determine that the power outputted by the solar panel has returned to the expected power range; and
   based on determining that the power outputted by the solar panel has returned to the expected power range, provide, for output to the automatic cleaning system, an instruction to deactivate the automatic cleaning system.

8. The monitoring system of claim 6, wherein the monitor control unit is configured to:
   receive weather data indicating atmospheric conditions at the property; and
   determine that debris has likely accumulated on the solar panel based on the weather data.

9. The monitoring system of claim 1, comprising an automatic tilt system that is configured to adjust a tilt angle of the solar panel,
   wherein the monitor control unit is configured to:
      receive automatic tilt system data indicating an availability of the automatic tilt system;
      determine the likely cause of the deviation from the expected power range by determining that the solar panel is not tilted toward a sun;
      determine the action to perform to remediate the likely cause of the deviation from the expected power range by determining to adjust the tilt angle of the solar panel; and
      provide, for output to the automatic tilt system, an instruction to adjust the tilt angle of the solar panel.

10. The monitoring system of claim 9, wherein, after providing, for output to the automatic tilt system, the instruction to adjust the tilt angle of the solar panel, the monitor control unit is configured to:
   determine that the power outputted by the solar panel has returned to the expected power range; and
   based on determining that the power outputted by the solar panel has returned to the expected power range, provide, for output to the automatic tilt system, an instruction to cease adjusting the tilt angle of the solar panel.

11. The monitoring system of claim 1, comprising:
   an aerial drone comprising a camera,
   wherein the monitor control unit is configured to:
      receive aerial drone data indicating an availability of the aerial drone;
      based on determining that the power outputted by the solar panel has deviated from the expected power range, provide, for output to the aerial drone, an instruction to capture an image of the solar panel;
      receive, from the aerial drone, the image of the solar panel; and
      determine the likely cause of the deviation from the expected power range based further on the image of the solar panel.

12. The monitoring system of claim 1, wherein the monitor control unit is configured to calculate the expected power range based on one or more of:
   a geographic location of the solar panel;
   a time of day;
   a time of year;
   a weather condition at the geographic location of the solar panel; and
   an age of the solar panel.

13. The monitoring system of claim 1, wherein the monitor control unit is configured to:
   calculate, based on a power outputted by the solar panel at a first time and a power outputted by the solar panel at a second time, a rate of change of power outputted by the solar panel between the first time and the second time;
   determine that the rate of change of power outputted by the solar panel is greater than a threshold rate of change;

determine a likely cause of the rate of change of power outputted by the solar panel being greater than the threshold rate of change; and determine an action to perform to remediate the likely cause of the rate of change of power outputted by the solar panel being greater than the threshold rate of change.

14. The monitoring system of claim 1, wherein the action comprises transmitting a notification to a resident of the property indicating that the power outputted by the solar panel has deviated from the expected power range.

15. The monitoring system of claim 1, wherein the action comprises transmitting a notification to a resident of the property recommending replacement of the solar panel.

16. A computer-implemented method, comprising:

receiving, from a sensor and by a monitoring system that is configured to monitor a property, sensor data that reflects an attribute of the property;

monitoring, by the monitoring system, power outputted by a solar panel that is configured to generate and output power;

determining, by the monitoring system, that the power outputted by the solar panel has deviated from an expected power range;

based on determining that the power outputted by the solar panel has deviated from the expected power range, accessing, by the monitoring system, the sensor data;

based on the power outputted by the solar panel and the sensor data, determining, by the monitoring system, a likely cause of the deviation from the expected power range; and determining, by the monitoring system, an action to perform to remediate the likely cause of the deviation from the expected power range.

17. The method of claim 16, comprising:

receiving, by the monitoring system, automatic snow melt system data indicating an availability of an automatic snow melt system that comprises a heating element that is configured to transfer heat to the solar panel;

determining, by the monitoring system, the likely cause of the deviation from the expected power range by determining that snow has likely accumulated on the solar panel;

determining, by the monitoring system, the action to perform to remediate the likely cause of the deviation from the expected power range by determining to activate the automatic snow melt system to melt the snow; and providing, by the monitoring system and for output to the automatic snow melt system, an instruction to activate the heating element.

18. The method of claim 16, comprising:

receiving, by the monitoring system, automatic cleaning system data indicating an availability of an automatic cleaning system that is configured to remove debris from the solar panel;

determining, by the monitoring system, the likely cause of the deviation from the expected power range by determining that debris has likely accumulated on the solar panel;

determining, by the monitoring system, the action to perform to remediate the likely cause of the deviation from the expected power range by determining to activate the automatic cleaning system; and providing, by the monitoring system and for output to the automatic cleaning system, an instruction to activate the automatic cleaning system.

19. The method of claim 16, comprising:

receiving, by the monitoring system, automatic tilt system data indicating an availability of the automatic tilt system that is configured to adjust a tilt angle of the solar panel;

determining, by the monitoring system, the likely cause of the deviation from the expected power range by determining that the solar panel is not tilted toward a sun;

determining, by the monitoring system, the action to perform to remediate the likely cause of the deviation from the expected power range by determining to adjust the tilt angle of the solar panel; and providing, by the monitoring system and for output to the automatic tilt system, an instruction to adjust the tilt angle of the solar panel.

20. The method of claim 16, comprising:

calculating, by the monitoring system and based on a power outputted by the solar panel at a first time and a power outputted by the solar panel at a second time, a rate of change of power outputted by the solar panel between the first time and the second time;

determining, by the monitoring system, that the rate of change of power outputted by the solar panel is greater than a threshold rate of change;

determining, by the monitoring system, a likely cause of the rate of change of power outputted by the solar panel being greater than the threshold rate of change; and determining, by the monitoring system, an action to perform to remediate the likely cause of the rate of change of power outputted by the solar panel being greater than the threshold rate of change.

* * * * *